(12) United States Patent
Huang et al.

(10) Patent No.: US 12,259,619 B2
(45) Date of Patent: Mar. 25, 2025

(54) DISPLAY DEVICE AND MANUFACTURING METHOD THEREOF

(71) Applicant: HKC CORPORATION LIMITED, Guangdong (CN)

(72) Inventors: Hao Huang, Guangdong (CN); Rongrong Li, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/336,086

(22) Filed: Jun. 16, 2023

(65) Prior Publication Data
US 2024/0085748 A1 Mar. 14, 2024

(30) Foreign Application Priority Data
Sep. 9, 2022 (CN) .......................... 202211100723.X (51) Int. Cl.
*G02F 1/1347* (2006.01)
*G02F 1/13* (2006.01)
*H01L 25/075* (2006.01)

(52) U.S. Cl.
CPC ........ *G02F 1/13471* (2013.01); *G02F 1/1323* (2013.01); *H01L 25/0753* (2013.01)

(58) Field of Classification Search
CPC .... G02F 1/1323; G02F 1/1347; G02B 6/0078
See application file for complete search history.

(56) References Cited

U.S. PATENT DOCUMENTS

| 4,443,065 A | * | 4/1984 | Funada | ............. | G02F 1/133636 |
| | | | | | 349/181 |
| 2002/0054247 A1 | * | 5/2002 | Hwang | ................ | G02F 1/1368 |
| | | | | | 257/E21.414 |
| 2008/0180622 A1 | * | 7/2008 | Horiguchi | ......... | G02F 1/134309 |
| | | | | | 349/139 |

(Continued)

FOREIGN PATENT DOCUMENTS

| CN | 1752800 A | 3/2006 |
| CN | 101556425 A | 10/2009 |

(Continued)

OTHER PUBLICATIONS

The first office action issued in corresponding CN application No. 202211100723.X dated Jun. 20, 2023.

(Continued)

*Primary Examiner* — Alexander P Gross
(74) *Attorney, Agent, or Firm* — HAUPTMAN HAM, LLP (57) ABSTRACT

The present disclosure provides a display device and a manufacturing method thereof. The display device includes a display module and a function module. The display module includes a first substrate and a plurality of light emitting units. The plurality of light emitting units are located on a side of the first substrate. A light emitting direction of the light emitting units are oriented towards the first substrate. The function module is located on a surface of the first substrate away from the light emitting units. The function module and the light emitting units share the first substrate. A surface of the function module close to the first substrate is in direct contact with the surface of the first substrate away from the light emitting units.

13 Claims, 6 Drawing Sheets

(56) References Cited

U.S. PATENT DOCUMENTS

| | | | | |
|---|---|---|---|---|
| 2008/0273159 A1* | 11/2008 | Seok | ............... | G02F 1/1347 349/158 |
| 2011/0317120 A1* | 12/2011 | Kajiya | ............... | G02F 1/13439 349/149 |
| 2012/0194753 A1* | 8/2012 | Shin | ............... | G02F 1/133788 349/123 |
| 2016/0179452 A1* | 6/2016 | Huang | ............... | G09G 3/36 345/3.1 |
| 2018/0108284 A1 | 4/2018 | Chu et al. | | |

FOREIGN PATENT DOCUMENTS

| | | | | |
|---|---|---|---|---|
| CN | 101937910 A | * | 1/2011 | ........... G03F 7/2004 |
| CN | 102221757 A | * | 10/2011 | ........... G02B 6/0078 |
| CN | 103915481 A | | 7/2014 | |
| CN | 204790254 U | | 11/2015 | |
| CN | 105446028 A | | 3/2016 | |
| CN | 106054423 A | | 10/2016 | |
| CN | 106291800 A | | 1/2017 | |
| CN | 106773180 A | | 5/2017 | |
| CN | 109901249 A | | 6/2019 | |
| CN | 110121676 A | | 8/2019 | |
| CN | 110750009 A | | 2/2020 | |
| CN | 110767696 A | | 2/2020 | |
| CN | 111025733 A | | 4/2020 | |
| CN | 111599942 A | | 8/2020 | |
| CN | 111929943 A | * | 11/2020 | |
| CN | 112150970 A | | 12/2020 | |
| CN | 112363334 A | | 2/2021 | |
| CN | 112447786 A | | 3/2021 | |
| CN | 113078199 A | | 7/2021 | |
| CN | 214427916 U | | 10/2021 | |
| CN | 214540288 U | | 10/2021 | |
| CN | 113641016 A | | 11/2021 | |
| CN | 215118140 U | | 12/2021 | |
| CN | 113900299 A | | 1/2022 | |
| CN | 114170905 A | | 3/2022 | |
| CN | 114442344 A | | 5/2022 | |
| CN | 114512505 U | | 5/2022 | |
| CN | 216562344 U | | 5/2022 | |
| CN | 114649494 A | | 6/2022 | |
| CN | 114758587 A | | 7/2022 | |
| CN | 114859586 A | | 8/2022 | |
| CN | 114967238 A | | 8/2022 | |
| JP | 2002107750 A | | 4/2002 | |
| KR | 20080103848 A | | 11/2008 | |
| TW | M616056 U | | 8/2021 | |
| WO | 203746370 A1 | | 7/2014 | |

OTHER PUBLICATIONS

WIPO, International Search Report and Written Opinion for International Application No. PCT/CN2023/100191, Aug. 7, 2023.

The second office action issued in corresponding CN application No. 202211100723.X dated Sep. 2, 2023. 28 pages with English translation.

The third office action issued in corresponding CN application No. 202211100723.X dated Dec. 15, 2023. 20 pages with English translation.

Haifeng Wang et al. LED Driver Design for Backlight of LCD, Chinese Journal of Liquid Crystals and Displays, vol. 23, No. 4, Aug. 2008.

Notice of Registration issued in corresponding CN application No. 202211100723.X dated Mar. 7, 2024.

* cited by examiner

DISPLAY DEVICE AND MANUFACTURING METHOD THEREOF

CROSS-REFERENCE TO RELATED APPLICATIONS

This application claims priority benefits to Chinese Patent Application No. 202211100723.X, filed Sep. 9, 2022, the contents of which are incorporated herein by reference.

TECHNICAL FIELD

The present disclosure relates to the field of displays, and in particular to a display device and a manufacturing method thereof.

BACKGROUND

Display technology has always been one of the most important areas of research in electronic devices. With the increasing development of display technology, various displays have emerged and function modules can be integrated into a display to achieve more functions. However, the integration of the function modules into the the display leads to a problem of overall thickness.

SUMMARY

The present disclosure discloses a display device which can solve the technical problem of large overall thickness of the display device.

In a first aspect, the present disclosure provides a display device. The display device includes a display module and a function module. The display module includes a first substrate and a plurality of light emitting units. The plurality of light emitting units are located on a side of the first substrate. A light emitting direction of the light emitting units are oriented towards the first substrate. The function module is located on a surface of the first substrate away from the light emitting units. The function module and the light emitting units share the first substrate. A surface of the function module close to the first substrate is in direct contact with the surface of the first substrate away from the light emitting units.

As the light emitting units are reversely mounted on a side of the first substrate, such that the function module can be set on the surface of the first substrate away from the light emitting units, and the function module and the light emitting units share the first substrate, thus reducing a thickness in a lamination direction of the function module and the first substrate as well as reducing material costs.

In a second aspect, the present disclosure provides a manufacturing method for a display device. The manufacturing method of the display device includes: providing a display module, light emitting units of the display module being configured to be reversely mounted; forming a function module on a surface of the first substrate of the display module away from the light emitting units; a surface of the function module close to the first substrate is in direct contact with a surface of the first substrate away from the light emitting units.

BRIEF DESCRIPTION OF THE ACCOMPANYING DRAWINGS

In order to illustrate more clearly the technical solutions in the embodiments of the present disclosure, a brief description of the accompanying drawings to be used in the embodiments will be given below. It will be obvious that the accompanying drawings in the following description are only some of the embodiments of the present disclosure. For a person of ordinary skill in the art, other accompanying drawings can be obtained on the basis of these without any creative labour effort.

Description of label: display device—1; display module—11; first substrate—111; light emitting unit—112; driving circuit—113; third substrate—114; array substrate—115; encapsulation layer—116; frame body—117; display LCD layer—118; color film substrate—119; first polarizer—11a; second polarizer—11b; optical element—11c; refractive element—11c1; collimator—11c2; function module—12; first electrode layer—121; functional liquid crystal layer—122; second electrode layer—123; second substrate—124; electronic device—2; housing—21.

DETAILED DESCRIPTION OF ILLUSTRATED EMBODIMENTS

The technical solutions in the embodiments of the present disclosure will be clearly and completely described below with reference to the accompanying drawings in the embodiments of the present disclosure. Obviously, the embodiments described are only a part of the embodiments of the present disclosure, and not all of them. Based on the embodiments in the present disclosure, all other embodiments obtained without creative work by a person of ordinary skill in the art shall fall within a protection scope of the present disclosure.

Figure 1:
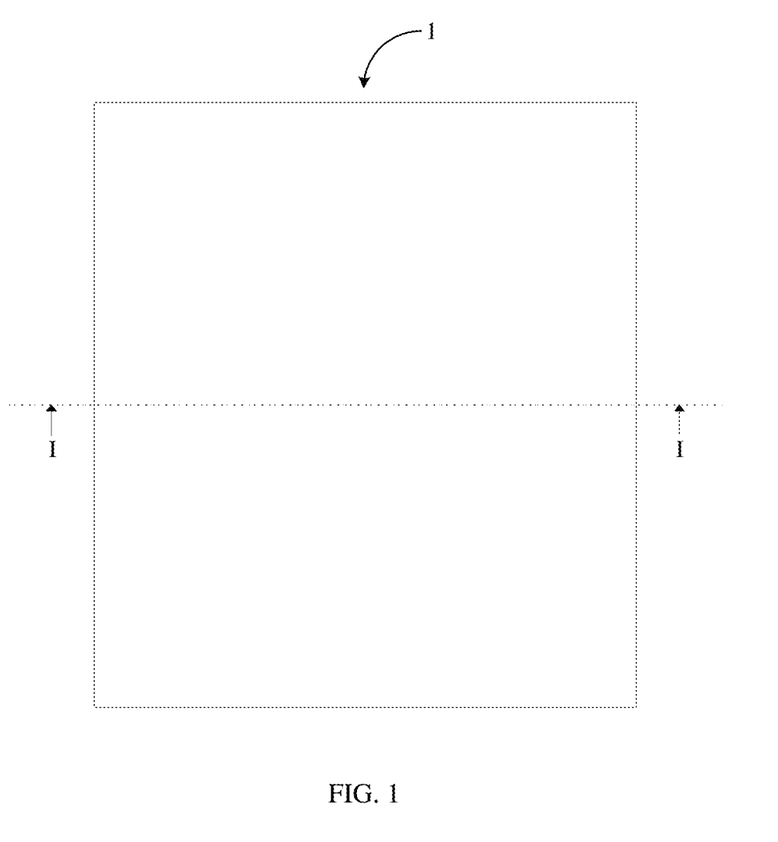
FIG. 1 is a schematic top view of a display device according to a first embodiment of the present disclosure.
Figure 2:
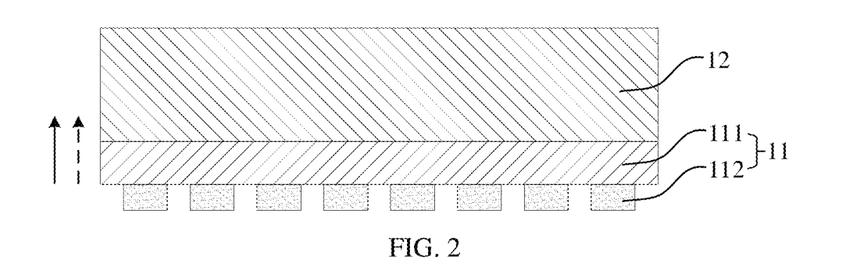
FIG. 2 is a cross-sectional view along line I-I in FIG. 1.

The present disclosure provides a display device 1. Please referring together to FIGS. 1 and 2, FIG. 1 is a schematic top view of a display device according to a first embodiment of the present disclosure; FIG. 2 is a cross-sectional view along line I-I in FIG. 1. The display device 1 includes a display module 11 and a function module 12. The display module 11 includes a first substrate 111 and a plurality of light emitting units 112. The plurality of light emitting units 112 are located on a side of the first substrate 111. A light emitting direction of the light emitting units 112 are oriented towards the first substrate 111. The function module 12 is located on a surface of the first substrate 111 away from the light emitting units 112. The function module 12 and the light emitting units 112 share the first substrate 111. A surface of the function module 12 close to the first substrate 111 is in direct contact with the surface of the first substrate 111 away from the light emitting units 112.

It should be noted that the light emitting units 112 typically include a plurality of colour sub-pixels. The light emitting units 112 operates to emit light and to process the light emitted by the light emitting units 112 to achieve a display function of the display module 11. Generally, the light emitting units 112 are located on a side of the first substrate 111. A light emitting direction of the light emitting units 112 may be in a direction away from a side of the first substrate 111, i.e. the light emitting units 112 may be forward mounted. The light emitting direction of the light emitting units 112 may also be in a direction towards a side of the first substrate 111 as shown by the dashed arrow in FIG. 2, i.e. the light emitting units 112 may be reversely mounted. The plurality of light emitting units 112 are reversely mounted on a side of the first substrate 111, either on a surface of the first substrate 111 or in a direction towards the first substrate 111, which are not limited by the present disclosure.

In detail, the function module 12 has transmittance and is able to perform various functions by processing the light emitted by the light emitting units 112. For example, when the function module 12 is an anti-peep LCD box, the light emitted by the light emitting units 112 is rotated to change a direction of the light, enabling anti-peep functions at different angles. Therefore, the function module 12 needs to be mounted in a direction of the light emitted by the light emitting units 112.

In at least one embodiment, the light emitting units 112 can be a Micro LED or a Mini LED. The light emitting units 112 can directly emit light in three colours: red, blue or yellow, which is not limited by the present disclosure. The light emitting units 112 are reversely mounted on a side of the first substrate 111, so that the first substrate 111 has extra space on a side of the light emitting units 112 in a light emitting direction to set the function module 12, thereby achieving the the function module 12 and the light emitting units 112 to share the first substrate 111.

It can be understood that, in at least one embodiment, since the light emitting units 112 are reversely mounted on a side of the first substrate 111, so that the function module 12 can be disposed on a surface of the first substrate 111 away from the light emitting units 112, and the function module 12 and the light emitting units 112 share the first substrate 111, thereby reducing a thickness in a lamination direction of the function module 12 and the first substrate 11 (as shown by a solid line in FIG. 2) as well as reducing material costs.

Figure 3:
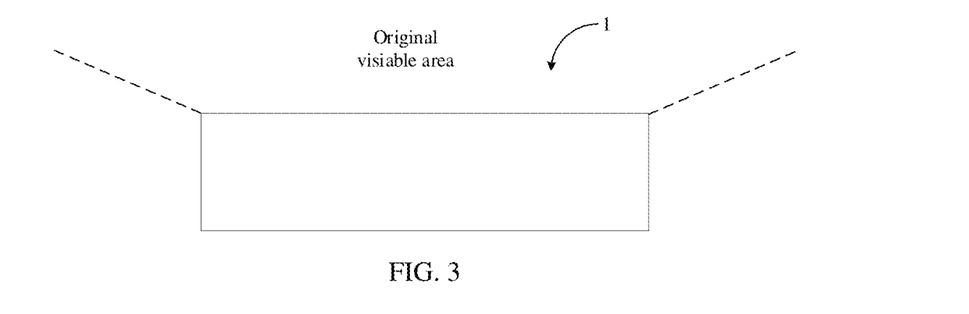
FIG. 3 is a schematic view of a visible area of the display device in a prior art.
Figure 4:
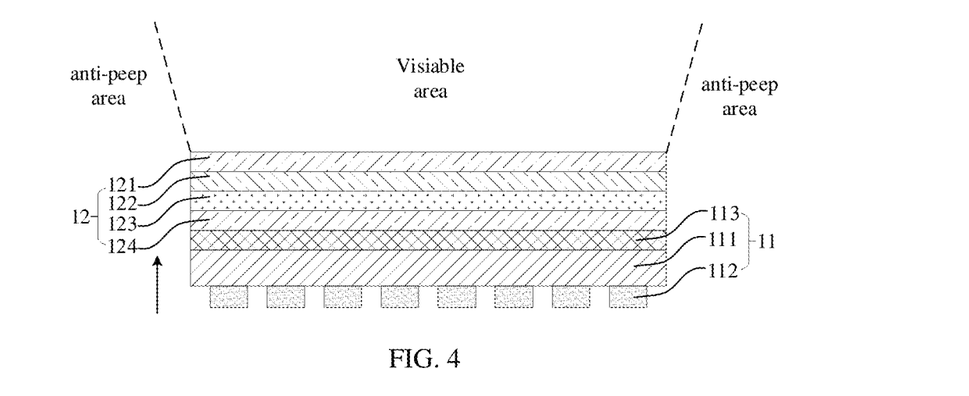
FIG. 4 is a cross-sectional view of a function module according to a first embodiment of the present disclosure.

In one possible embodiment, please referring together to FIGS. 3 and 4, FIG. 3 is a schematic view of a visible area of the display device in a prior art; FIG. 4 is a cross-sectional view of a function module according to a first embodiment of the present disclosure. The function module 12 includes a first electrode layer 121, a functional liquid crystal layer 122, a second electrode layer 123 and a second substrate 124. The first electrode layer 121 is located on a surface of the first substrate 111 away from the display module 11. A surface of the first electrode layer 121 close to the first substrate 111 is in direct contact with the surface of the first substrate 111 away from the light emitting units 112. The functional liquid crystal layer 122 is located on a surface of the first electrode layer 121 away from the first substrate 111. The second electrode layer 123 is located on a surface of the functional liquid crystal layer 122 away from the first electrode layer 121. The second substrate 124 is located on a surface of the second electrode layer 123 away from the functional liquid crystal layer 122. A surface of the first electrode layer 121 adjacent to the functional liquid crystal layer 122 and a surface of the second electrode layer 123 adjacent to the functional liquid crystal layer 122 are coated with alignment materials, respectively.

In at least one embodiment, the function module 12 is a peep-proof liquid crystal cartridge and the alignment materials are polyimide materials. As shown in FIG. 4, since the surface of the first electrode layer 121 adjacent to the functional liquid crystal layer 122 and the surface of the second electrode layer 123 adjacent to the functional liquid crystal layer 122 are coated with alignment materials, respectively, which enables liquid crystal molecules in the functional liquid crystal layer 122 to stand. By loading different voltages at the two ends of the first electrode layer 121 and the second electrode layer 123, the liquid crystal molecules in the functional liquid crystal layer 122 are driven to rotate under the action of an electric field, thereby changing an angle of the light emitted by the light emitting units 112 emitted by the function module 12, so as to change a size of the original visible area as in FIG. 3. It can be understood that with the first electrode layer 121 and the second electrode layer 123 loaded with voltage, the light emitted by the light emitting units 112 passes through the liquid crystal molecules in the functional liquid crystal layer 122 to spin the light so that the light is concentrated towards the visible area as shown in FIG. 4 and not towards a peep-proof area, thus achieving a peep-proof function.

It will be appreciated that in other possible embodiments, the function module 12 may also be other devices that process the light emitted by the light emitting units 112 differently in order to achieve different functions, which are not limited by the present disclosure.

Figure 5:
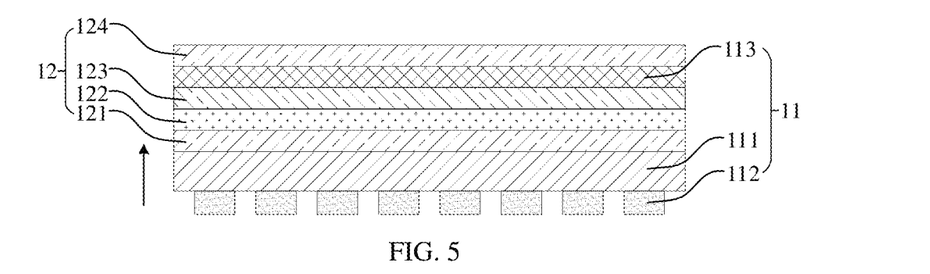
FIG. 5 is a cross-sectional view of a function module according to a second embodiment of the present disclosure.

In one possible embodiment, please referring together to FIGS. 4 and 5, FIG. 5 is a cross-sectional view of a function module according to a second embodiment of the present disclosure. The display module 11 further includes a driving circuit 113. The driving circuit 113 is configured to drive the light emitting units 112 to work. The driving circuit 113 is formed in the first electrode layer 121 or the second electrode layer 123.

In detail, generally, the light emitting units 112 requires the driving circuit 113 to provide a driving signal to drive the light emitting units 112 to operate. It will be appreciated that, in at least one embodiment, as the light emitting units 112 are reversely mounted, the driving circuit 113 is formed in the first electrode layer 121 or the second electrode layer 123, as opposed to the prior art where the driving circuit 113 is set inside the display module 11, further reducing the thickness of the display module 11 in the lamination direction (as shown by the solid arrows in FIGS. 4 and 5).

Also, when the driving circuit 113 is formed in the first electrode layer 121, the driving signal provided by the driving circuit 113 can be loaded directly to the first electrode layer 121; or, when the driving circuit 113 is formed in the second electrode layer 123, the driving signal provided by the driving circuit 113 can be loaded directly to the second electrode layer 123, thereby saving a certain amount of circuit design.

It is to be noted that the driving circuit 113 can be electrically coupled to the light emitting units 112 by punching of holes in the display area of the display module 11, or it can be electrically coupled to the light emitting units 112 by cable routing in a non-display area of the display module 11. The present disclosure is not limited in this respect.

Figure 6:
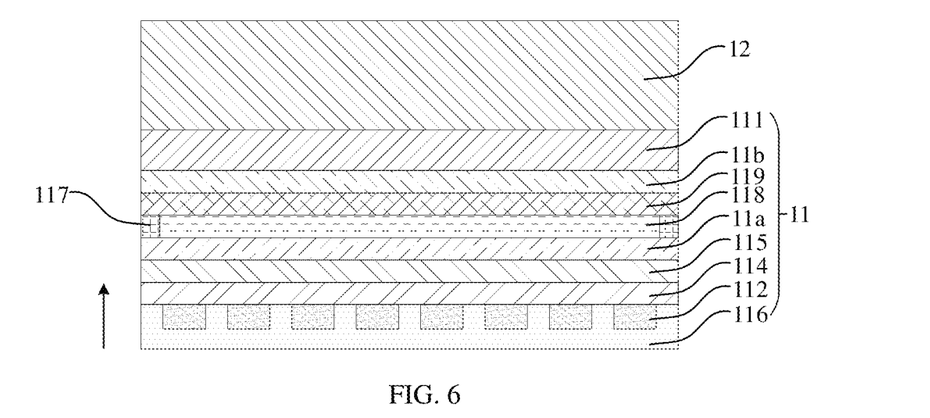
FIG. 6 is a cross-sectional view of a display module according to a second embodiment of the present disclosure.

In one possible embodiment, referring to FIG. 6 together, FIG. 6 is a cross-sectional view of a display module according to a second embodiment of the present disclosure. The display module 11 further includes a third substrate 114 and an array substrate 115. The light emitting units 112 are reversely mounted on a surface of the third substrate 114. The array substrate 115 is located on a surface of the third substrate 114 away from the light emitting units 112. The array substrate 115 and the light emitting units 112 share the third substrate 114. A surface of the array substrate 115 close to the third substrate 114 is in direct contact with a surface of the third substrate 114 away from the light emitting units 112.

In detail, as shown in FIG. 6, the display module 11 further includes an encapsulation layer 116, a frame body 117, a display LCD layer 118, a color film substrate 119, a first polarizer 11a and a second polarizer 11b. The encapsulation layer 116 is configured to encapsulate the light emitting units 112. The frame body 117 is configured to prevent a flow of liquid crystals in the display LCD layer 118. The color film substrate 119 is configured to filter the light emitted by the light emitting units 112. The first polarizer 11a is located on a surface of the array substrate 115 away from the third substrate 114 for deflecting the light emitted by the light emitting units 112. The second polarizer 11b is located on a surface of the color film substrate 119 away from the display LCD layer 118 for biasing the light emitted by the light emitting units 112. It is to be noted that, unlike the first embodiment, in this embodiment the light emitting units 112 are the light emitting units of the backlight module in the display device 1. The light emitted by the light emitting units 112 are mixed to form white light.

It is to be noted that, generally, the array substrate 115 is provided with a plurality of thin film transistors for selectively driving the corresponding the light emitting units 112 to work under the loading of the driving signal transmitted by the driving circuit 113. In at least one embodiment, the array substrate 115 and the light emitting units 112 share the third substrate 114, in other words, the plurality of thin film transistors are formed on a surface of the third substrate 114 away from the light emitting units 112 by a technical process of exposure development, coating, etching, etc, thus reducing the thickness of the display module 11 in the lamination direction (as shown by a solid arrow in FIG. 6).

In at least one embodiment, the colour film substrate 119 is obtained by forming a red/green/blue colour filter on a glass substrate by a technical process such as exposure development, coating, etching and the like. The light emitting units 112 are transferred to a surface of the third substrate 114 by using a mass-transfer technology. For example, when the light emitting units 112 are Mini LEDs, the encapsulation layer 116 also needs to be treated with self-generated blue light and Y phosphor, the encapsulation layer 116 is usually made of a material that is resistant to high temperatures and corrosion.

In detail, the color film substrate 119 is laminated to the array substrate 115, then the gaps between the two are aligned by Fine Seam Vertical Alignment technique to align light, a surface of the array substrate 115 away from the third substrate 114 is provided with the first polarizer 11a.

It will be understood that in at least one embodiment, the array substrate 115 and the light emitting units 112 share the third substrate 114, thus allowing the modular production of the display module 11 to omit the light source of the module, whose production module only requires a production of a backplane as a frame, making the production module thinner and lighter. Specifically, the thickness of the display module 11 in the lamination direction can be achieved to be about 1.5 mm or less, and the thickness of the display device 1 in the lamination direction can be achieved to be 3 mm or less without including the driver motherboard.

Figure 7:
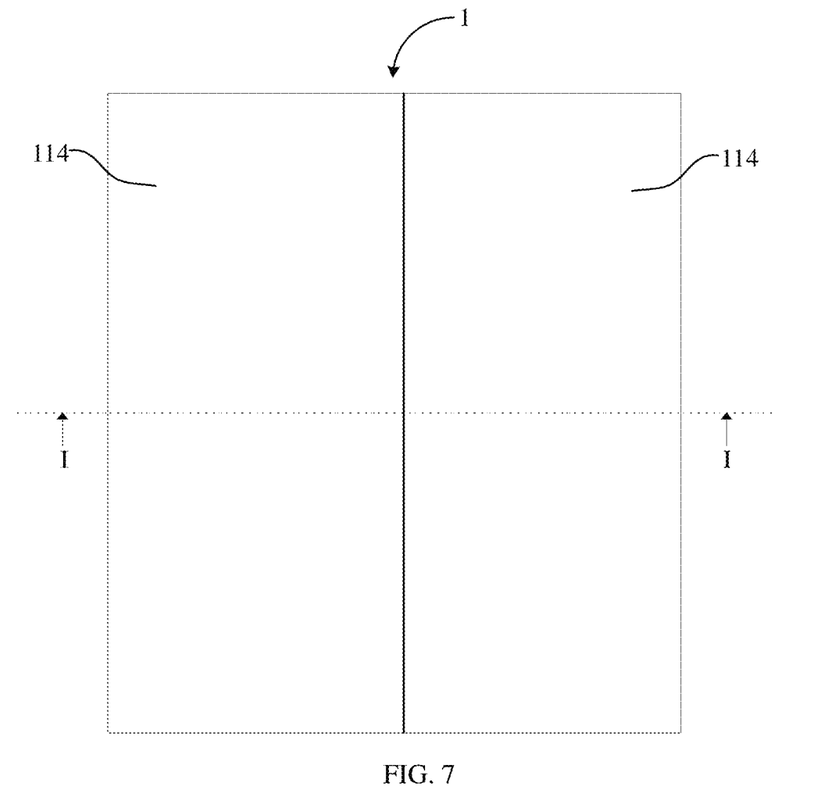
FIG. 7 is a top view of a display device according to a third embodiment of the present disclosure.

In one possible embodiment, please referring together to FIG. 7, FIG. 7 is a top view of a display device according to a third embodiment of the present disclosure. A quantity of the third substrates is greater than or equal to two, and a plurality of the third substrates are stitched together to form a display area of the display module.

It is to be noted that the quantity of the light emitting units 112 that can be carried, driven by a single third substrate 114 is usually limited, so that a plurality of the third substrates 114 are normally stitched together in order to accommodate a larger display device 1 with a larger display size. Thus, in at least one embodiment, the display size of the display device 1 is increased by stitching the plurality of the third substrate 114 together.

Figure 8:
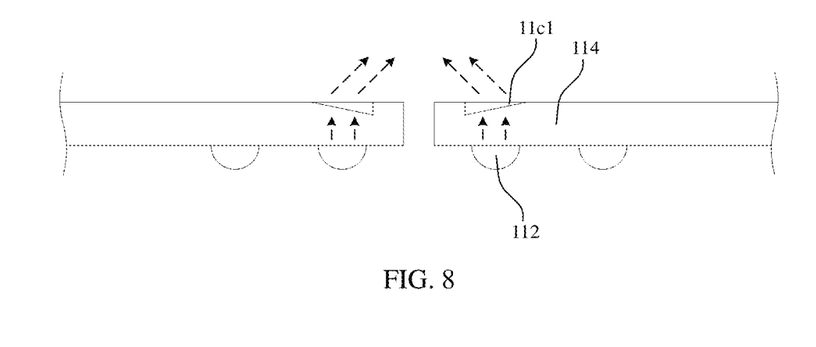
FIG. 8 is a schematic partial cross-sectional view along line I-I in FIG. 7.

In a possible embodiment, please referring together to FIG. 8, FIG. 8 is a schematic partial cross-sectional view along line I-I in FIG. 7. The display module 11 further includes an optical element 11c. The optical element 11c is used to change a direction of the light emitted by the light emitting units 112. The optical element 11c is located on a surface of the third substrate 114 away from the light emitting units 112.

In at least one embodiment, the optical element 11c changes a direction of the light emitted by the light emitting units 112, to further improve a display of the display device 1 or to change a size of the visible area of the display device 1, so as to achieve a better anti-peep effect. At the same time, the optical element 11c is located within the third substrate 114 to avoid affecting a thickness of the display device 1 in the lamination direction. The surface of the third substrate 114 away from the light emitting units 112 are flat and can be in direct contact with other layer structures.

It is to be noted that in at least one embodiment, in order to ensure that the surface of the third substrate 114 can be provided with circuitry, i.e. to ensure that the surface of the third substrate 114 to be flat, the optical element 11c can be formed inside of the third substrate 114 by a technical processes such as opening recesses, side etching, etc. The present disclosure does not limit the process of forming the optical element 11c.

In one possible embodiment, referring to FIG. 8 again, there is a gap between two adjacent third substrates 114. The optical element 11c includes a refractive element 11c1. The refractive element 11c1 is located adjacent to the gap for deflecting light from the light emitting units 112 to a side of the gap.

It should be understood that by stitching the plurality of the third substrate 114 together, the gap as shown in FIG. 8 may exist at the plurality of the third substrates 114 stitched together. Due to the existence of the gap, the distance between the light emitting units 112 adjacent to the gap will be greater than the distance between the rest of the adjacent light emitting units 112, resulting in the the light emitting units 112 at the gap being insufficiently bright and prone to produce the undesirable display effect of a "dark seam".

Therefore, in at least one embodiment, the refractive element 11c1 is located adjacent to the gap so that the light emitted by the light emitting unit 112 is deflected to the side of the gap. A refracted effect of the light emitted by the light emitting unit 112 passes through the refractive element 11c1 is shown by the dashed arrow in FIG. 8, thereby complementing the luminous brightness at the gap and improving the display effect.

It is to be understood that for the display device 1 where the quantity of the third substrate 114 is one, i.e. for the display device 1 with a smaller display size, and in particular for the display device 1 where the light emitting units 112 are Mini LEDs, the peripheral part of the display area of the display device 1 may be susceptible to undesirable display phenomena such as dark edges due to the insufficient brightness of the light emitting units 112. In other possible embodiments, the refractive element 11c1 may also be provided corresponding to the perimeter of the third substrate 114, so that the light emitted by the light emitting unit 112 is deflected towards a side of the non-display area of the display device 1, i.e. towards the dark edge area so that the dark edge problem is solved and the display of the display device 1 is improved.

Figure 9:
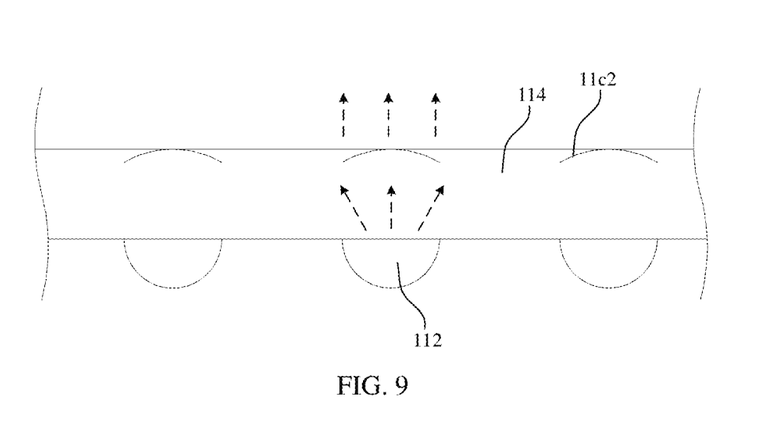
FIG. 9 is a partially enlarged schematic view along line I-I in FIG. 7.

In one possible embodiment, referring to FIG. 9, FIG. 9 is a partially enlarged schematic view along line I-I in FIG. 7. The optical element 11c includes a collimator 11c2. The collimator 11c2 is located in the direction of the light emitted by the light emitting units 112, corresponding to the light emitting unit 112s. The collimator 11c2 is used to collimating the light emitted by the light emitting units 112.

It is to be noted that the light emitted by the light emitting unit 112 is initially divergent, i.e. as shown by the dashed arrow in FIG. 9 which does not pass through the part of the collimator 11c2. Thus, in at least one embodiment, the collimator 11c2 collimates the light emitted by the light emitting units 112 such that the rest of the light emitted by the light emitting units 112, except for that emitted by the light emitting unit 112 along the lamination direction (as shown by a solid arrow in FIG. 9), is eliminated or weakened, thereby achieving an effect of increasing the anti-peep area.

Figure 10:
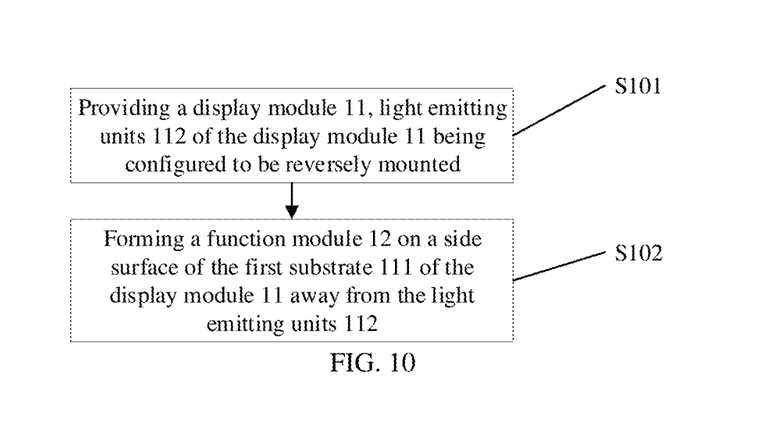
FIG. 10 illustrates a flowchart of a manufacturing method of the display device according to a first embodiment of the present disclosure.

It is to be noted that the first substrate 111, the second substrate 124 and the third substrate 114 referred to in the present disclosure both have transmittance, for example, the first substrate 111, the second substrate 124 and the third substrate 114 are glass substrate. It is to be understood that the material of the first substrate 111, the second substrate 124 and the third substrate 114 are not limited in the present disclosure, as long as they do not affect the transmittance of the first substrate 111, the second substrate 124 and the third substrate 114. In order to ensure that the surface of the first substrate 111, the second substrate 124 and the third substrate 114 can be provided with circuits, i.e. to ensure that the first substrate 111, the second substrate 124 and the third substrate 114 are flat, circuits formed on the first substrate 111, the second substrate 124 and the third substrate 114 can be formed in interior of the first substrate 111, the second substrate 124 and the third substrate 114 by technical processes such as recessing, side etching, etc. The present disclosure does not limit this The present disclosure also provides a manufacturing method of a display device, referring together with FIG. 10, FIG. 10 illustrates a flowchart of a manufacturing method of the display device according to a first embodiment of the present disclosure. The manufacturing method of the display device includes steps S101, S102, wherein steps S101, S102 are described in detail as follows.

S101, a display module 11 is provided, light emitting units 112 of the display module 11 are configured to be reversely mounted;

S102, a function module 102 is formed on a surface of the first substrate 111 of the display module 11 away from the light emitting units 112.

A surface of the function module 12 close to the first substrate 111 is in direct contact with the surface of the first substrate 111 away from the light emitting units 112.

In detail, the display module 11, the light emitting unit 112, the function module 12 and the first substrate 111 are described above and will not be repeated here. It will be understood that in at least one embodiment, since the light emitting unit 112 is reversely mounted on a side of the first substrate 111, so that the function module 12 is located on a surface of the first substrate 111 away from the light emitting unit 112, and the function module 12 and the light emitting unit 112 share the first substrate 111, thereby reducing a thickness in a lamination direction of the function module 12 and the first substrate 111, and also reducing material costs. The material costs are also reduced.

In one possible embodiment, the step of forming the function module 102 on the surface of the first substrate 111 of the display module 11 away from the light emitting units 112, specifically includes following steps.

A first electrode layer 121 is formed on a surface of the first substrate 111 away from the light emitting units 12.

Alignment materials are coated to a surface of the first electrode layer 121 away from the first substrate 111.

A functional liquid crystal layer 122 is formed on a surface of the first electrode layer 121 away from the first substrate 111.

A second substrate 124 is provided.

A second electrode layer 123 is formed on a surface of the second substrate 124.

Alignment materials are coated to a surface of the second electrode layer 123 away from the second substrate 124.

A surface of the second electrode layer 123 away from the second substrate 124 is joined to the functional liquid crystal layer 122 to form the function module 12;

A fine seam vertical alignment process is applied to the function module 12.

In detail, the first electrode layer 121, the alignment materials, the functional liquid crystal layer 122, the second substrate 124, the second electrode layer 123 are described above and will not be repeated here. It should be noted that, in other possible embodiments, it is also possible to first form the second electrode layer 123 on a surface of the second substrate 124, then form the first electrode layer 121, the functional liquid crystal layer 122, and combine the second electrode layer 123 with the functional liquid crystal layer 122; it is also possible to form the functional liquid crystal layer 122 on a surface of the second substrate 124 away from the second electrode layer 123, which is not limited here.

In one possible embodiment, before forming the first electrode layer 121 on the surface of the first substrate 111 away from the light emitting units 112, the manufacturing method of the display device further includes a following step.

A driving circuit 113 is formed on a surface of the first substrate 111 away from the light emitting units 112.

Or, before forming the second electrode layer 123 on the surface of the second substrate 124, the manufacturing method of the display device further includes a following step.

A driving circuit 113 is formed on a surface of the second substrate 124.

In particular, the driving circuit 113 is described above and will not be repeated herein.

Figure 11:
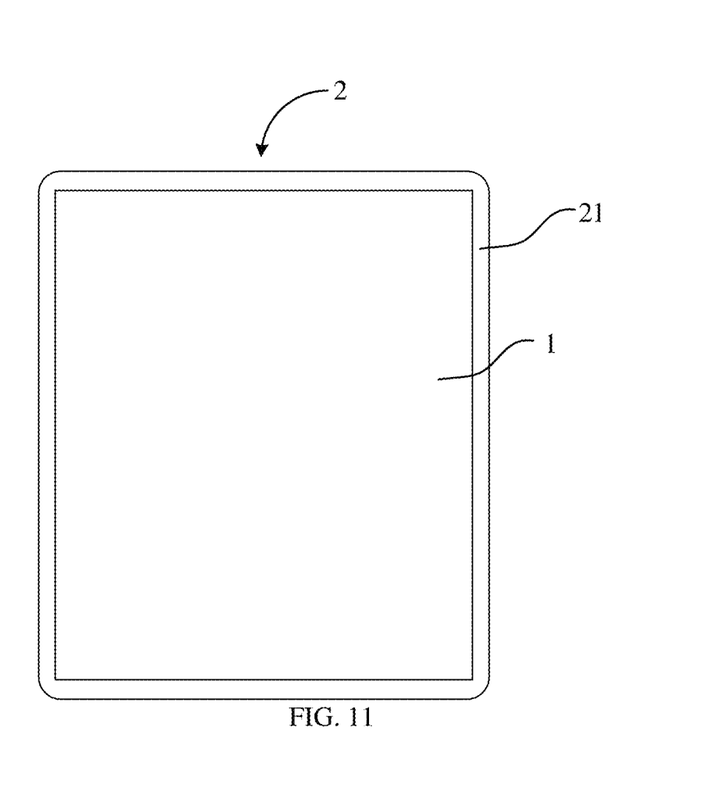
FIG. 11 shows a schematic diagram of a top view of an electronic device according to a first embodiment of the present disclosure.

The present disclosure also provides an electronic device 2, referring together with FIG. 11, FIG. 11 shows a schematic diagram of a top view of an electronic device according to a first embodiment of the present disclosure. The electronic device 2 includes a housing 21 and a display device 1 as described above. The housing 21 is configured to hold the display device 1. Specifically, the display device 1 is described above and will not be repeated herein.

It should be noted that the electronic device 2 in the embodiments of the present disclosure can be an electronic device 2 in a mobile phone, smartphone, tablet, e-reader, wearable portable device, laptop, etc., which can communicate with a data transfer server via the internet. The data transfer server can be an instant messaging server, an SNS (Social Networking Services) server, etc., which is not limited by the embodiments of the present disclosure.

The above descriptions are only intended to assist in understanding the core ideas of the present disclosure; at the same time, for a person of ordinary skill in the art, there may be changes in the specific embodiment and scope of present disclosure based on the ideas of the present disclosure. In general, the contents of the present disclosure should not be construed as limiting the present disclosure.

What is claimed is:

1. A display device, comprising:
a display module and a function module;
the display module comprises a first substrate, a plurality of light emitting units, a third substrate and an array substrate;
the plurality of light emitting units are located on a surface of the third substrate,
the array substrate is located on another surface of the third substrate away from the light emitting units;
the first substrate is located on a surface of the array substrate away from the third substrate;
the plurality of light emitting units are located on a side of the first substrate, a light emitting direction of the light emitting units are oriented towards the first substrate;
the function module is located on a surface of the first substrate away from the light emitting units;
a surface of the function module close to the first substrate is in direct contact with the surface of the first substrate away from the light emitting units, the function module is configured for spinning light of the light emitting units so that the light is concentrated towards a visible area, which changes a size of an original visible area of the display module, wherein the original visible area is greater than the visible area;
wherein
the function module comprises a first electrode layer, a functional liquid crystal layer, a second electrode layer and a second substrate;
the first electrode layer is located on a surface of the first substrate away from the light emitting units;
a surface of the first electrode layer close to the first substrate is in direct contact with the surface of the first substrate away from the light emitting module;
the functional liquid crystal layer is located on a surface of the first electrode layer away from the first substrate;
the second electrode layer is located on a surface of the functional liquid crystal layer away from the first electrode layer;
the second substrate is located on a surface of the second electrode layer away from the functional liquid crystal layer;
a surface of the first electrode layer adjacent to the functional liquid crystal layer and a surface of the second electrode layer adjacent to the functional liquid crystal layer are coated with alignment materials, respectively;
the display module further comprises a driving circuit, wherein
the driving circuit is formed in the first electrode layer or the second electrode layer,
the driving circuit is connected to the first electrode layer or the second electrode layer, and connected to the plurality of light emitting units, and
the driving circuit is configured to drive the plurality of light emitting units to light and provide a driving signal to the first electrode layer or the second electrode layer.

2. The display device according to claim 1, wherein the array substrate and the light emitting units share the third substrate;
a surface of the array substrate close to the third substrate is in direct contact with the surface of the third substrate away from the light emitting units.

3. The display device according to claim 2, wherein a quantity of the third substrates is greater than or equal to two; a plurality of the third substrates are stitched together to form a display area of the display module.

4. The display device according to claim 3, wherein the display module further comprises an optical element, the optical element is configured to change a direction of light emitted by the light emitting units;
the optical element is located on the surface of the third substrate away from the light emitting units.

5. The display device according to claim 4, wherein the optical element comprises a collimator, the collimator is located in a direction of the light emitted by the light emitting units corresponding to the light emitting units, the collimator is configured for collimating the light emitted by the light emitting units.

6. The display device according to claim 4, wherein a gap is defined between two adjacent third substrates; the optical element comprises a refractive element; the refractive element is located adjacent to the gap for deflecting the light emitted by the light emitting units towards a side of the gap.

7. The display device according to claim 6, wherein the refractive element comprises a vertical surface and an inclined surface, the vertical surface is adjacent to the gap, the inclined surface is disposed on a side of the vertical surface away from the gap, the vertical surface and the inclined surface are connected to form a sharply angled groove, the sharply angled groove forms an opening in a surface of the third substrate facing toward the array substrate.

8. The display device according to claim 1, wherein the first substrate, the second substrate, and the third substrate are light transmissive.

9. A manufacturing method for a display device, the manufacturing method comprising:
providing a display module, a plurality of light emitting units of the display module being configured to be reversely mounted; wherein
the display module comprises a first substrate, a plurality of light emitting units, a third substrate and an array substrate;
the plurality of light emitting units are located on a surface of the third substrate, the array substrate is located on another surface of the third substrate away from the light emitting units;
the first substrate is located on a surface of the array substrate away from the third substrate; and the plurality of light emitting units are located on a side of the first substrate, a light emitting direction of the light emitting units are oriented towards the first substrate;

forming a function module on a surface of the first substrate of the display module away from the light emitting units;

wherein a surface of the function module close to the first substrate is in direct contact with the surface of the first substrate away from the light emitting units;

wherein the function module spins light of the light emitting units so that the light is concentrated towards a visible area, which changes a size of an original visible area of the display module, wherein the original visible area is greater than the visible area;

wherein the forming the function module on the surface of the first substrate of the display module away from the light emitting units specifically comprises:

forming a first electrode layer on the surface of the first substrate away from the light emitting units;

coating alignment materials to a surface of the first electrode layer away from the first substrate;

forming a functional liquid crystal layer on the surface of the first electrode layer away from the first substrate;

providing a second substrate;

forming a second electrode layer on a surface of the second substrate;

coating alignment materials to a surface of the second electrode layer away from the second substrate;

joining the surface of the second electrode layer away from the second substrate to the functional liquid crystal layer to form the function module;

applying a fine seam vertical alignment process to the function module;

wherein before forming the first electrode layer on the surface of the first substrate away from the light emitting units, the manufacturing method of the display device further comprises:

forming a driving circuit on the surface of the first substrate away from the light emitting unit; or before forming the second electrode layer on the surface of the second substrate, the manufacturing method of the display device further comprises:

forming a driving circuit on a surface of the second substrate, wherein the driving circuit is connected to the first electrode layer or the second electrode layer, and connected to the plurality of light emitting units, and the driving circuit is configured to drive the plurality of light emitting units to light and provide a driving signal to the first electrode layer or the second electrode layer.

10. The manufacturing method for the display device according to claim 9, wherein the display module further comprises an optical element, the optical element comprises a collimator, the collimator is located in a direction of the light emitted by the light emitting units corresponding to the light emitting units, the collimator is configured for collimating the light emitted by the light emitting units.

11. The manufacturing method for the display device according to claim 10, wherein a gap is defined between two adjacent third substrates; the optical element comprises a refractive element; the refractive element is located adjacent to the gap for deflecting the light emitted by the light emitting units towards a side of the gap.

12. The manufacturing method for the display device according to claim 11, wherein the refractive element comprises a vertical surface and an inclined surface, the vertical surface is adjacent to the gap, the inclined surface is disposed on a side of the vertical surface away from the gap, the vertical surface and the inclined surface are connected to form a sharply angled groove, the sharply angled groove forms an opening in a surface of the third substrate facing toward the array substrate.

13. The manufacturing method for the display device according to claim 9, wherein the first substrate, the second substrate, and the third substrate are light transmissive.

* * * * *